Jan. 9, 1951 M. S. GLASS 2,537,341

TUNING ARRANGEMENT

Filed May 22, 1944 3 Sheets-Sheet 1

INVENTOR
M. S. GLASS
BY
Franklin Mohr
ATTORNEY

Jan. 9, 1951 M. S. GLASS 2,537,341

TUNING ARRANGEMENT

Filed May 22, 1944 3 Sheets-Sheet 2

INVENTOR
M. S. GLASS
BY
Franklin Mohr
ATTORNEY

Jan. 9, 1951 M. S. GLASS 2,537,341

TUNING ARRANGEMENT

Filed May 22, 1944 3 Sheets-Sheet 3

INVENTOR
M. S. GLASS
BY Franklin Mohr
ATTORNEY

Patented Jan. 9, 1951

2,537,341

UNITED STATES PATENT OFFICE 2,537,341

TUNING ARRANGEMENT

Myron S. Glass, West Orange, N. J., assignor to Bell Telephone Laboratories, Incorporated, New York, N. Y., a corporation of New York Application May 22, 1944, Serial No. 536,761

3 Claims. (Cl. 250—36)

This invention relates to electromagnetic resonators and more particularly to an arrangement and method for tuning and stabilizing the frequency of such resonators, especially for use in amplifiers, oscillators, and related apparatus suitable to be employed with microwaves.

It is known that when an electromagnetic resonator is connected to a utilization circuit such as a load device, a transmission line, an antenna or the like, the resonant frequency or frequencies of the system as a whole are generally not the same as for the resonator alone, being materially affected by the value of the impedance presented to the resonator by the connected circuits. A similar depedence of the resonant frequency upon the connected circuits appears when the resonator is used as a part of an oscillation generating system. In this case the operating frequency of the system as a whole is dependent upon the characteristic properties of the connected circuits as well as those of the resonator. It is also known that the tuning of the system may be changed by varying the impedance of the load or other connected circuit. Tuning systems based upon this principle have been employed heretofore but with varying success, it having been found that a change in the reactance of the load circuit may affect not only the frequency of the generated oscillations but may at the same time either increase or decrease the amplitude of the oscillations. In general, the operating frequency and power output of an oscillator are functions of the particular value of a complex impedance into which the oscillator delivers power. The exact effect of a reactance change or of any impedance change in the circuit depends upon the position in the part of the circuit at which the change is made. It will be understood, of course, that the connected circuit in a microwave system is usually in the nature of a transmission line of material length compared with the operating wavelength. The question will arise, therefore, as to the location in the transmission line at which the impedance change should be made. For tuning purposes, it is desirable that the impedance change shall affect only the frequency and not the amplitude of the oscillations.

An object of the present invention is to determine a position in the connected circuit or transmission line at which a variation of reactance alone will produce purely a frequency change and a variation of resistance purely an amplitude change.

A further object of the invention is to design a variable reactance tuning element with the inherent property of stabilizing the operating frequency of the system at whatever frequency value the tuning element is initially adjusted to maintain.

Figure 1:
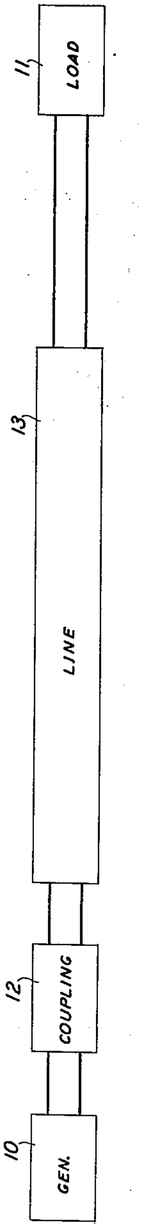
Figs. 1 and 2 are schematic diagrams useful in explaining the operation of the invention and its underlying principles.

Referring to Fig. 1, there is shown diagrammatically a generator or oscillator 10 connected to a load 11 through a connecting circuit which is represented in two parts consisting of a coupling device 12 and a transmission line 13. The generator 10 is assumed to comprise the usual parts essential to an oscillating system, namely, a resonator of some kind and means for maintaining self-oscillations in the reasonator. The load 11 may be of any type capable of utilizing oscillations produced by the generator 10. The coupling device 12 may be in the nature of an adapter between the generator 10 and the transmission line 13. Elements corresponding to 10, 11, 12 and 13, respectively, will generally be included in a typical microwave system because it will not usually be possible or convenient to connect the generator by direct physical connection to the load. The generator and load may be separated by a distance of several wavelengths and the impedance characteristics of the load will not match the impedance of the generator except in a very unusual case. The separation in space between the generator and the load is usually bridged by a transmission line, generally of uniform impedance. The coupling 12 is preferably designed to effect a smooth impedance transition between the generator 10 and the line 13. In some cases, another coupling device may be necessary between the line 13 and the load 11, but for simplicity it may be assumed that the load 11 is matched to the line 13. The principle of the invention is the same whether the load is directly matched to the line or whether an impedance transforming coupling is inserted therebetween.

In practicing as well as explaining the invention, I use as a reference condition a state of impedance match between the line 13 and the load 11. In this condition there is no reflection of waves at the junction between the line and the load. Hence, there are no standing waves in any part of the system to the right of the generator 10 in the reference condition. The waves entering the line 13 from the coupling 12 are pure traveling waves as long as the reference condition is maintained. The system shown in Fig. 1, or any generating system in the reference condition, will be found to have a definite operating frequency and will supply a definite power output, which values can be measured by known means. Furthermore, it will be found that if any change is made in the system whereby a departure occurs from the reference condition, the value of the operating frequency or of the power output or both will change.

Figure 2:
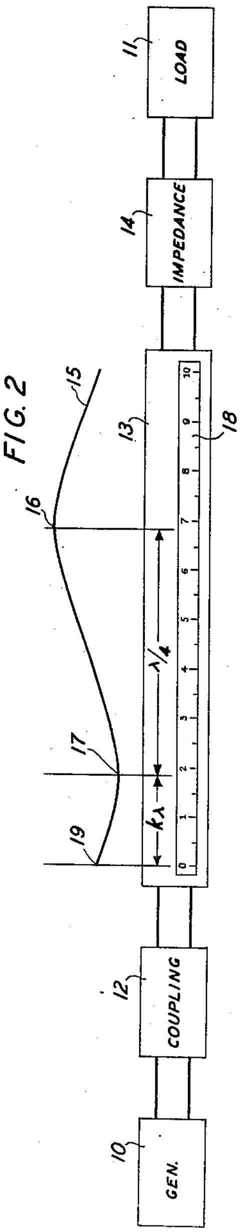

A change from the reference condition may be produced, as shown schematically in Fig. 2, by inserting an arbitrary impedance 14 anywhere between the generator 10 and the load 11, or even inside the generator 10. In order that the effect may appear in the line 13, the impedance 14 is preferably inserted between the line 13 and the load 11. The presence of the impedance 14 produces an impedance mismatch between the line 13 and the load 11 with consequent reflection of the wave at the junction of the line 13 and the impedance 14. The reflected wave interferes with the forwardly transmitted wave in the line 13 to produce a standing wave pattern on the line, the amplitude of the wave at successive points along the line in an illustrative case being represented graphically by the curve 15. The standing wave pattern will exhibit certain definite points of maximum and minimum amplitude, a maximum being illustrated at the point 16 and a minimum at the point 17. The relative positions of the points 16 and 17 and other points along the line 13 may be indicated by means of a scale 18 with respect to any arbitrary reference point fixed with respect to the line 13. At the zero point of the scale 18, the amplitude of the wave illustrated is indicated by the point 19.

In accordance with known wave theory, a pair of adjacent maximum and minimum points, such as 16 and 17, are separated by a quarter wavelength in the line. Accordingly, the difference in position of the points 16 and 17 on the scale 18 determines the wavelength of the generated wave produced when the impedance 14 has been inserted in the system. In general, as above noted, the wavelength and the operating frequency, with the impedance 14 inserted, will differ from the values of these quantities in the reference condition. The power output of the system with the impedance 14 inserted may be measured by known methods and will generally differ from the normal power in the reference condition.

The system represented in Fig. 2 is capable of yielding further information concerning the performance of the system with the impedance 14 inserted. This information includes the ratio of amplitude between the maximum and minimum, which ratio is commonly called the standing wave ratio. A further piece of information consists in the relative position of a maximum or minimum with respect to the scale 18. For example, the position of the minimum 17 may be observed and expressed as a number of wavelengths or fractions thereof, as represented by $k\lambda$ in Fig. 2, where $k$ represents the number of wavelengths and fraction thereof between the points 17 and 19.

Figure 3:
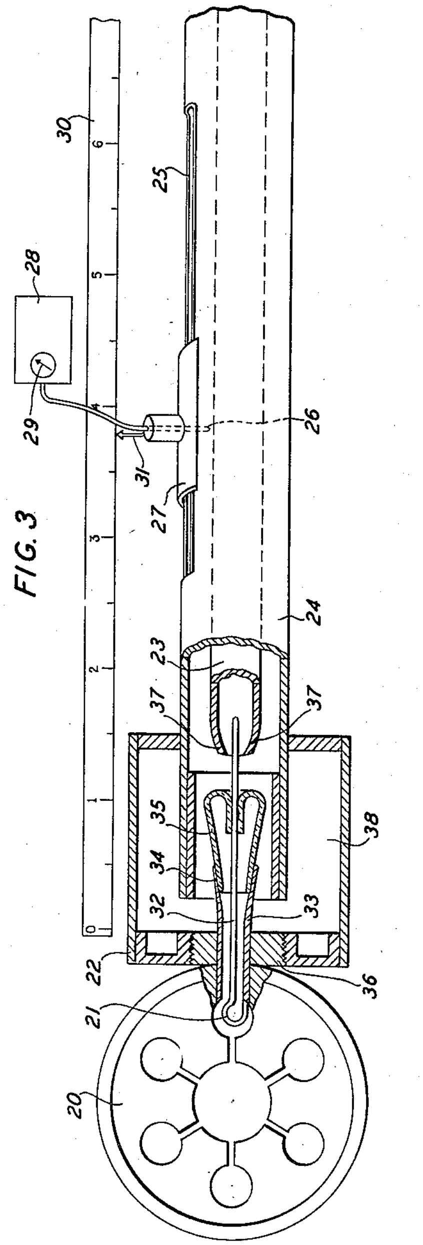
Fig. 3 is a view, partly in section and partly diagrammatic, of a testing system useful in practicing the invention.

Fig. 3 represents an experimental system for determining the values of a curve such as 15 of Fig. 2. In Fig. 3, the generator 10 has been particularized and represented as a magnetron 20, shown conventionally with a multicavity resonator having a coupling loop 21 inserted in one of the internal resonating cavities. An adapter or coupling device 22 is illustrated for joining the coupling loop 21 with a coaxial transmission line, the latter having an inner conductor 23 and an outer conducting sheath 24. A slot 25 running axially with respect to the sheath 24 is provided for inserting a movable probe 26 for sampling the amplitude of the wave in the line at any point over an extended range. The probe 26 may be held in any suitable manner as by means of a slidable cylindrical segment plate 27 and may be connected to an amplitude measuring device or detector of any known form as represented by a box 28 which may include a visual amplitude indicator such as a meter 29. A scale 30, corresponding to the scale 18 in Fig. 2, may be provided in a suitable position to be read in conjunction with a pointer or index 31 attached to the slider 27.

With the system in the reference condition, the slider 27 may be moved to any position along the slot 25 and assuming the measuring device to be functioning, the reading of the meter 29 will not vary regardless of the reading of the index 31 on the scale 30. If, however, an impedance mismatch is provided anywhere to the right of the probe 26, a standing wave pattern will be set up and the reading of the meter 29 will vary according to the position of the probe 26 and consequently of the index 31.

The magnetron 20, coupling loop 21 and adapter 22 do not form a part of the present invention but are merely illustrative of an oscillation generator and of a type of intermediate apparatus which may be present between the generator and the line. The occasion for the adapter 22 arises from the physical nature of the output circuit and vacuum sealing arrangements which are a part of the particular magnetron chosen for illustration. The loop 21 is extended to form a straight rod 32 which forms the inner conductor of a coaxial line having a conductive sheath 33, the latter serving as a bushing through which the conductor 32 enters the resonator of the magnetron. The protruding end of the sheath 33 has a flared and tapered edge 34 to which is sealed in known manner an insulating tube 35 which may be of glass and which is also sealed to the rod 32 as shown. The sheath 32 has a threaded collar 36 which matches a corresponding internal thread in the adapter 22, whereby an electrically conductive connection is formed between the sheath 33 and the adapter 22, which latter in turn may be conductively and mechanically joined to the sheath 24 of the line in any suitable manner in the position shown. The inner conductor 23 may be hollow and formed with fingers as shown at 37 to clamp upon and make electrical contact with the rod 32. The adapter contains a peripheral chamber 38, the profile of which may be designed in conjunction with the profile of the flared edge 34 and the collar 36 to provide a stub line to prevent reflection of the wave by the flared edge and collar in progressing from the loop 21 to the main body of the transmission line. The effective length of the stub line should be a half-wavelength or else an integral number of wavelengths plus a half-wavelength.

With the arrangement shown in Fig. 3, all the data may be obtained for a curve like curve 15 of Fig. 2 from which may be derived the standing wave ratio, the wavelength associated with the standing wave pattern, and the displacement of the minimum point from the zero line of reference of the scale 30. The wavelength associated with the reference condition and the power output in any condition may be measured by means of standard apparatus known to the art.

The magnetron 20 is intended to be illustrative of any oscillation generating device and the combination of the loop 21, adapter 22 and associated parts, is intended to represent any substantially reflectionless connection between the generator and the line.

Figure 5:
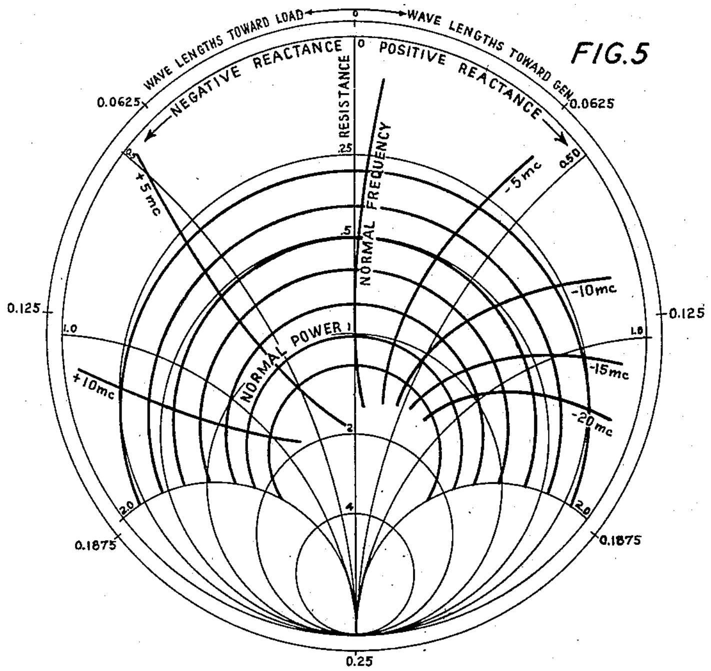
Figs. 4 and 5 are plots of data obtainable with apparatus as shown in Fig. 3 in a system operated under conditions represented in Figs. 1 and 2.
Figure 4:
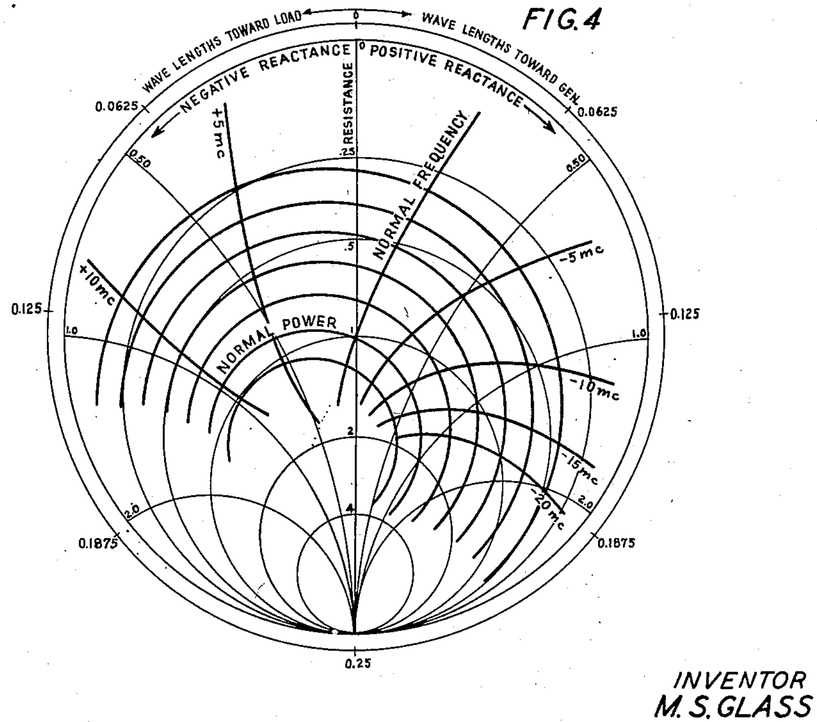

In the immediate neighborhood of the normal operating frequency and normal power of a given system, there is a unique one-to-one correspondence between the pair of values for the frequency and power on the one hand and the pair of values for the standing wave ratio and the position of a selected minimum (or maximum) amplitude on the line. By plotting the frequency power values against the standing wave ratio minimum position values, I secure a convenient graphical representation from which I am able to select a point or position along the line 13 where the insertion of a pure reactance will change only the operating frequency or have a substantially negligible effect upon the power output of the system over a useful tuning range. The chart to which I have referred, is most convenient if plotted in specially selected coordinates in a form comprising what is termed a "transmission line calculator" in an article by that title by P. H. Smith published in Electronics, issue of January 1939, pages 29–31, the chart in question appearing as Fig. 3 of the cited article. The transmission line calculator of Smith is reproduced in Figs. 4 and 5 herein in abbreviated form, showing only a few of the coordinate lines of the background in order to avoid confusion. The radiating heavy lines in Figs. 4 and 5 represent lines of equal frequency while the heavy nearly circular lines represent lines of equal power. The fainter lines are the coordinate lines of the Smith calculator and represent respectively resistance changes and reactance changes in the load. The changes are expressed relatively with respect to the numerical value of the impedance of the load in the reference condition which impedance is the characteristic impedance of the transmission line. Constant resistance contours are shown in the diagram as a set of circles having their centers on the vertical axis of the chart and all tangent to each other at the bottom point. Contours of constant reactance are shown by curves radiating upwardly and outwardly from the bottom point of the chart.

Reference may be had to the cited article in Electronics for a more complete description of the coordinate system of the chart. Briefly, the center of the chart represents the reference condition of the system, in other words, unity standing wave ratio, and normal operating frequency and power. Angular displacements with respect to the center of the diagram represent displacements of position along the transmission line in terms of wavelengths with respect to any arbitrary reference position in the line. Circles, concentric with the center of the chart, correspond to standing wave ratios different from unity. For simplicity in exhibiting and using the chart, it is customary to omit radial lines denoting angular displacements and concentric circles denoting standing wave ratios.

An example will serve to show how a frequency power pair of values may be plotted against a corresponding standing wave ratio position pair of values. Suppose a given operating frequency and given power is found to correspond to a standing wave ratio of 2 and that the minimum point is located a sixteenth of a wavelength from the zero point of the scale 18 or 30. Using any radial line of the chart to correspond to zero on the scale, an angle is measured in a clockwise direction one-eighth of a revolution and a radial line drawn (a complete wavelength corresponds to two complete revolutions on the chart). A concentric circle of proper radius to represent a standing wave ratio of 2 may then be drawn and at the intersection of this circle with the second-mentioned radial line is the point at which the given frequency power values are to be plotted.

By choosing successively different values for the impedance 14 any desired number of points may be plotted on the chart. The values of frequency and power will be found to be distributed in such manner that contour lines may be drawn on the chart in the form of constant frequency lines and constant power lines respectively. One of the constant frequency lines will pass through the center of the chart, this line representing the normal operating frequency, that is, the frequency of operation in the reference condition. Likewise, one of the constant power lines, namely, the line representing normal power, will pass through the center of the chart. Fig. 4 shows a representative plot with the normal frequency line and the normal power line labeled.

Fig. 5 shows the same data represented in Fig. 4, but with the contour lines rotated about the center of the chart by such an angle as to bring the normal frequency contour to a substantially vertical position at the center of the chart, in which case the normal power line passes substantially horizontally through the center point. The transformation of the chart from the state shown in Fig. 4 to that shown in Fig. 5 corresponds merely to a change in the position of the arbitrary zero point on the scale. Strictly, there is a slight error involved in the rotation of the contour lines due to the fact that a wavelength is thereby taken as an invariable unit independent of the frequency. It is contemplated, however, that the frequency changes which are desired and which will be included in the range covered by the tests are relatively small in proportion to the value of the normal frequency and, provided this is true, the change in wavelength will be negligible, as far as its effect in distorting the chart is concerned. In a system in which the illustrated measurements were made, the normal frequency was in the neighborhood of 3,000 megacycles and each radiating line represents a deviation of 5 megacycles or one-sixth of one per cent.

My invention is based upon the discovery that the frequency and power contours, when they have been properly rotated as in Fig. 5, follow approximately the direction of the constant resistance and constant reactance contours respectively. This is especially true in the immediate neighborhood of the normal operating frequency. It will be evident that there is a relationship between the inserted impedance and the resulting frequency such that if the impedance is inserted at the proper position in the line, the insertion of a pure reactance will result in substantially a frequency change alone without an accompanying change in power. Similarly, the insertion of a pure resistance in the same position in the line will result in a change in power with substantially no change in frequency. For example, the insertion of a positive reactance of value approximately one-quarter the characteristic impedance of the line results in a frequency decrease of five megacycles with negligible change in power.

The angle by which the chart is rotated in passing from Fig. 4 to Fig. 5 is a measure of the distance in wavelengths which separates the arbitrary zero point on the scale 18 or 30 from a critical point on the line at which impedances may be inserted to secure the desired interdependence between frequency changes and power changes.

Having found the proper position for the insertion of the tuning element, a transmission system may be designed with a tuning element in the desired place. It is important to note that the chart may be calibrated for the insertion of impedance either in series with the line or in parallel with the line. In general, the critical point for insertion of the impedance if once determined on the basis of a series insertion, will be a quarter wavelength distant from a similar critical point at which the insertion of a shunt or parallel impedance is appropriate.

The tuning element may conveniently be a tuning stub comprising an adjustable lentgh of either a coaxial line or a wave guide. The coaxial tuner will generally act as a parallel tuning element whereas the wave guide will act as a series element and either will supply a substantially pure reactance While the full set of contour lines plotted as in Figs. 4 and 5 is useful in analyzing the operation of the system and may give valuable information for design purposes, the proper position for the insertion of the tuning element may be determined from a single contour line, namely, the locus of points corresponding to the normal operating frequency. As hereinbefore described, the normal operating frequency is first determined by measuring the operating frequency with the system in a state substantially free from standing waves, hereinbefore referred to as the reference condition. The normal power output may or may not be measured in conjunction with the measurement of the normal operating frequency. The system may then be altered as hereinbefore described to produce in succession a plurality of states in which a standing wave pattern occurs in the system. These states of the system are preferably selected so that in each case the operating frequency is in the immediate neighborhood of the normal operating frequency, but if this is not convenient, the states may be selected at random and measurement continued until a plurality of measurements are obtained in the immediate neighborhood of the normal operating frequency. For each such state the standing wave ratio may be measured and also the position of a minimum (or maximum) amplitude point in the standing wave pattern may be located with respect to the arbitrary reference point in the transmission line, which point has been selected as hereinbefore described. The measured values of operating frequency in the neighborhood of the normal operating frequency may then be plotted as hereinbefore described, against the background coordinate system comprising values of standing wave ratio and position of minimum (or maximum) amplitude as coordinates as in Fig. 4. The locus of points corresponding to the normal operating frequency may then be located and plotted as in Fig. 4, the locus passing through the center of the chart. The locus will usually be found to approximate a radial line. The arbitrary reference point will correspond to another radial line, the upwardly extending vertical radius in Fig. 4. The angle determined between the locus of normal operating frequency and the radius corresponding to the arbitrary reference point determines the distance in the transmission line between the arbitrary reference point and the critical point at which the operating frequency and the power output may be adjusted substantially independently of each other.

The required location of the critical point is of course not dependent upon the use of an angular coordinate, but will in general correspond, in any suitable coordinate system, to the difference between the average value of the position coordinate along the normal operating frequency locus and the position coordinate of the arbitrary reference point. The location may, although usually less conveniently, be determined by calculation without plotting the measured values.

Figures 6, 7, 8:
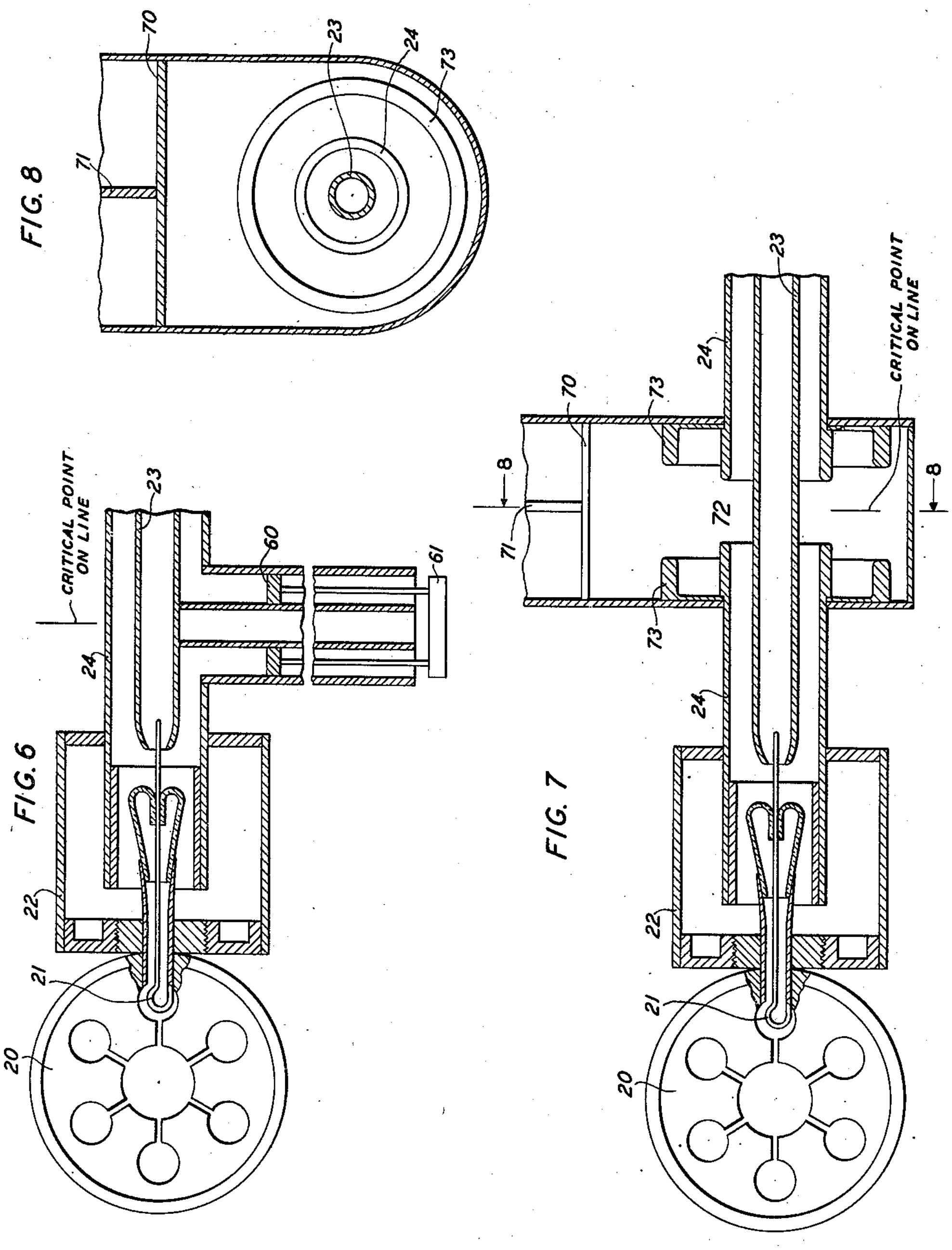
Fig. 6 is a view, partly in section and partly diagrammatic, showing a tuning arrangement according to the invention, employing a coaxial tuning element.
Fig. 7 is a view, partly in section and partly diagrammatic, showing an embodiment of the invention employing a tuning element constituting a wave guide or cavity resonator.
Fig. 8 is a cross-sectional view of the tuning device shown in Fig. 7.

Fig. 6 illustrates the application of a coaxial tuning stub at a predetermined critical position on the transmission line as may be determined in accordance with the principles of the invention. The tuning stub constitutes a means for introducing a substantially pure reactance in parallel with the line. The amount of the reactance introduced and hence the degree of frequency adjustment is controlled by adjusting the position of an annular short-circuiting slider 60 manipulated in any suitable manner as by a knob 61. Adjustment of the slider 60 is found to have negligible effect upon the power output of the system.

Figs. 7 and 8 show a wave guide type of tuner located a quarter-wavelength farther distant from the generator as compared with the coaxial tuner of Fig. 6. The tuner of Figs. 7 and 8 has a movable reflector 70 which may be manipulated by means of a rod 71. The sheath 24 has an annular break or slit 72 for coupling the tuner to the coaxial line. Annular reflectors 73 may be provided within the resonator for the purpose of breaking up oscillations of harmonic or other undesired modes. Here, again, the tuning adjustment is found to have negligible effect upon the power output of the system.

In accordance with known transmission line theory, either form of tuning stub may be displaced any integral number of half-wavelengths without changing its effect upon the tuning and power variation of the system.

The principles underlying the invention are useful not only in the design of tuning elements but they may be utilized also to improve the frequency stability of a system at any given setting of the tuning element. It will be evident from the foregoing explanation and from transmission line theory, that changes in load impedance or other line conditions are effective to change the operating frequency or the power output or both. A change in load condition which results in a change in operating frequency, an effect commonly referred to as "frequency pulling," may be thought of as introducing a change in the reactive component of the impedance measured at the above-mentioned critical point, since it has been shown that when the impedance measurement is made at the critical point, the power output of the oscillator varies with the resistive component while the frequency varies with the reactive component of the measured impedance. Introduction of positive reactance produces a decrease of frequency while addition of negative reactance produces an increase of frequency. Any tuning device introduced at the critical point will afford some degree of frequency stabilization if a change of frequency causes the tuner to introduce an opposing change of reactance. The system will oscillate at the frequency which corresponds to the net reactance in the line produced by the load plus the tuner or frequency stabilizer. Tuning stubs are found inherently to have reactance-frequency characteristics with the correct algebraic sign to result in frequency stabilization. By employing a tuning element which has a large rate of change of reactance with frequency, the tuning element can be made to exert a very considerable amount of stabilization. The tuner may be considered as a second resonator coupled to the internal resonator of the oscillator. By making the tuner relatively more stable than the internal resonator, the stability of the combination may be improved. In a tuning element, a large rate of change of reactance with frequency denotes a high degree of stability.

I have found that a wave guide tuner located with respect to the transmission line in accordance with the invention produces a greater degree of stabilization than is possible with a coaxial tuner. I have found also that the degree of stabilization offered by a wave guide tuner may be made very large by designing the tuner to operate so that the generated frequency approaches close to the cut-off frequency of the wave guide. It is known that near the cut-off frequency of a wave guide, the rate of reactance change with respect to frequency change becomes very great and it is this fact which is utilized in securing a greater degree of stabilization. There is an additional advantage in the use of a wave guide tuner adjusted close to the cut-off frequency in that the wavelength in the wave guide is considerably greater near the cut-off frequency so that more precise tuning adjustments may be made. In other words, the movement of the reflector 70 for a given frequency change is considerably lengthened by operating the tuner close to the cut-off frequency of the wave guide.

What is claimed is:

1. A tuning arrangement comprising an oscillator the frequency and the power output of which are functions of the particular value of a complex impedance into which the oscillator delivers power, a load device, a transmission line for transmitting power from said oscillator to said load device, means operative initially to substantially eliminate standing waves in said line when said oscillator is supplying power to said load device through said line, and a wave guide branch line coupled to said line for tuning purposes at a point in said line where the effect upon the oscillator of varying the impedance of said tuning means is substantially a maximum of frequency change for a minimum of change in the power output, the said wave guide branch line having a cut-off frequency below, and relatively close to, the desired tuning range, whereby frequency stabilization of the arrangement is promoted at an operating frequency within the desired tuning range.

2. A tuning arrangement comprising an oscillator the frequency and the power output of which are functions of the particular value of a complex impedance into which the oscillator delivers power, a load device, a transmission line of material length compared with the operating wavelength of the said oscillator for transmitting power from said oscillator to said load device, means operative initially to substantially eliminate standing waves in said line when said oscillator is supplying power to said load device through said line, and a wave guide branch line coupled to said line for tuning purposes at a point in said line at least a half wavelength from said oscillator where the effect upon the oscillator of varying the impedance of said tuning means is substantially a maximum of frequency change for a minimum of change in the power output, the said wave guide branch line having a cut-off frequency below, and relatively close to, the desired tuning range, whereby frequency stabilization of the arrangement is promoted at an operating frequency within the desired tuning range.

3. A coaxial transmission line having an inner conductor mounted within a hollow outer conductor, a hollow wave guide stub mounted upon said outer conductor, said outer conductor having an annular slit therein opening into said wave guide stub for coupling thereto, and an annular reflector mounted within said stub and surrounding said outer conductor of said coaxial transmission line for breaking up oscillations of harmonics or other undesired modes.

MYRON S. GLASS.

REFERENCES CITED

The following references are of record in the file of this patent:

UNITED STATES PATENTS

| Number | Name | Date |
|---|---|---|
| 2,147,807 | Alford | Feb. 21, 1939 |
| 2,258,148 | Schussler | Oct. 7, 1941 |
| 2,297,436 | Scholz | Sept. 29, 1942 |
| 2,337,934 | Scheldorf | Dec. 28, 1943 |
| 2,373,233 | Dow et al. | Apr. 10, 1945 |
| 2,404,082 | Mouromtseff et al. | July 16, 1946 |
| 2,404,279 | Dow | July 16, 1946 |
| 2,438,914 | Hansen | Apr. 8, 1948 |

OTHER REFERENCES

Hyper and Ultra-High Frequency Engineering, Sarbacher and Edson, John Wiley & Sons, Inc., 1943, pages 354 and 355.